US006396223B1

(12) United States Patent
Ohkawa

(10) Patent No.: US 6,396,223 B1
(45) Date of Patent: May 28, 2002

(54) CUSP FILTER

(75) Inventor: Tihiro Ohkawa, La Jolla, CA (US)

(73) Assignee: Archimedes Technology Group, Inc., San Diego, CA (US)

(*) Notice: Subject to any disclaimer, the term of this patent is extended or adjusted under 35 U.S.C. 154(b) by 0 days.

(21) Appl. No.: 09/556,047

(22) Filed: Apr. 21, 2000

(51) Int. Cl.[7] .................... C23C 14/35

(52) U.S. Cl. .................... 315/501; 315/502; 204/156

(58) Field of Search .................... 315/501, 502, 315/505, 507, 500; 204/156

(56) References Cited

U.S. PATENT DOCUMENTS

| | | | | |
|---|---|---|---|---|
| 3,722,677 A | | 3/1973 | Lehnert | |
| 5,350,454 A | | 9/1994 | Ohkawa | |
| 5,681,434 A | | 10/1997 | Eastlund | |
| 5,868,909 A | | 2/1999 | Eastlund | |
| 6,217,716 B1 | * | 4/2001 | Lai | 204/192.12 |

OTHER PUBLICATIONS

Yoshikawa et al., Plasma Confinement in a Toroidal Quadruppole, The Physics of Fluids, vol. 12, No. 9, Sep. 1969.

Ohkawa et al., Plasma Confinement in dc Octopole, Physical Review Letters, vol. 24, No. 3, Jan. 19, 1970.

Bonnevier, Experimental Evidence of Element and Isotope Separation in a Rotating Plasma, Plasma Physics, vol. 13, Pergamon Press 1971.

* cited by examiner

*Primary Examiner*—Kiet T. Nguyen

(74) *Attorney, Agent, or Firm*—Nydegger & Associates

(57) ABSTRACT

A cusp filter for altering a multi-species plasma to separate ions of different masses ($M_1$ and $M_2$) includes first and second axi-symmetric magnetic fields which are coaxial, have the same magnitude (B), and are oriented back-to-back to establish a null cusp. The null cusp is thus oriented perpendicular to the axis between the magnetic fields. An injector is provided for directing the plasma ions along the axis toward the null cusp to divert the ions ($M_1$) away from the axis and prevent them from crossing the null cusp, while allowing the ions ($M_2$) to cross the null cusp and proceed along the axis through the filter. In one embodiment, a cut-off mass, $M_c$, is determined such that $M_1<M_c<M_2$ with $M_c=e^2B^2r^2/2W$ where "e" is the ion charge, "r" is the radial distance of the ion from the axis, and W is its kinetic energy. In another embodiment, ions of selected mass are heated by cyclotron resonance to raise their energies above that of other ions in order to assure their passage through the null cusp. The selected ions then pass through the null cusp for separation from the other ions.

25 Claims, 2 Drawing Sheets

CUSP FILTER

FIELD OF THE INVENTION

The present invention pertains generally to devices which are useful for separating particles of a multi-species plasma according to their respective masses. More particularly, the present invention pertains to plasma mass filters which establish magnetic field configurations that direct charged particles along predetermined paths according to the mass of the specific particle. The present invention is particularly, but not exclusively, useful as a filter for a multi-species plasma that establishes a magnetic barrier which prevents selected particles from proceeding along a predetermined axial path through the filter.

BACKGROUND OF THE INVENTION

It can be mathematically shown that the constants of motion for a charged particle (e.g. an ion) in an axially symmetric magnetic field are its angular momentum, P, and its kinetic energy, W. Mathematically, using a cylindrical coordinate system [r, θ, z], these constants of motion can be expressed as:

$$P=Mrv_\theta+e\psi$$

$$W=[M/2][v_r^2+v_\theta^2+v_z^2]$$

Where

- "M" is the mass of the particle;
- "r" is the radial distance of the particle from the axis;
- "e" is the charge on a particle (ion);
- "ψ" is the flux function of the magnetic field; and
- "v" is velocity of the particle ($v_r$, $v_\theta$, and $v_z$ are components of "v").

Because the above expressions are general statements of the constants of motion, they are applicable to various situations and conditions. Specifically, for a configuration wherein two, otherwise substantially identical, axially symmetric magnetic fields are positioned co-axially, in an opposed back-to-back relationship, the above equations are applicable. For such a configuration, a null cusp is created in a plane perpendicular to the axis wherein the flux function, ψ, is equal to zero. Stated differently, the flux function on opposite sides of the null will have opposite signs in the axial (z) direction. As a consequence of this condition, a charged particle is able to cross the cusp only if it has the necessary momentum and energy to do so.

Because both the momentum and the energy of a particle are functions of the mass of the particle, and due to the fact there will be a conservation of the particle's momentum and energy in a system, an expression can be mathematically derived which will relate the mass of the particle to its ability to cross through a null cusp. Here, of course, we are considering the null cusp as described above. Specifically, in this context, for a given energy, W, and for a given magnetic field magnitude, B, a cut-off mass, $M_c$, can be identified such that particles with a mass $M_2$ greater than $M_c$ ($M_2>M_c$) will cross the null cusp, while particles with a mass $M_1$ less than $M_c$ ($M_1<M_c$) will not cross the null cusp. The expression for this $M_c$ is:

$$M_c=e^2B^2r^2/2W.$$

In another aspect of particle physics, it is well known that a charged particle in a magnetic field will have a cyclotron frequency, f, which can be mathematically expressed as: $f=Be/2\pi M$. Further, it is known that all charged particles are subject to cyclotron resonance heating wherein a charged particle (electrons or ions) will selectively absorb energy by resonance coupling. Importantly, this resonance coupling is a function of the mass of the particle. Therefore, all ions of a predetermined mass in a multi-species plasma can be selectively heated by resonance coupling, while ions of other masses are not so heated.

In the environment of the opposed axi-symmetric magnetic fields described above, it is to be appreciated that a charged particle (ion) can have either of two types of obits. In a so-called type-1 orbit, the projection of the orbit onto a plane perpendicular to the magnetic field does not encircle the origin. In this case (type-1 orbit) the angular momentum, P, and the magnetic flux function, ψ, have the same sign (i.e. $P\psi>0$). Also, $Mrv_\theta$is of opposite sign but is less than the flux function ψ(i.e. $|P|<|\psi|$). On the other hand, in a type-2 orbit the projection of the orbit onto a plane perpendicular to the magnetic field encircles the origin. In this case (type-2 orbit) the angular momentum, P, and the magnetic flux function, ψ, have opposite signs (i.e. $P\psi<0$). In this case, $Mrv_\theta$is greater in magnitude than the flux function ψ and is of opposite sign (i.e. $|P|<|\psi|$). It can be mathematically shown that the switch between a type-1 orbit and a type-2 orbit involves a large change in the angular momentum P. A consequence of this is that the orbit of a particle must change from type-1 to type-2, or vice versa, as a particle crosses through a null cusp.

It happens that the concepts discussed above regarding axi-symmetric magnetic fields, cyclotron resonance heating, and different type orbits, are not mutually exclusive. Specifically, for purposes of separating the charged particles of a multi-species plasma from each other according to their respective masses, the concepts just discussed can be used interrelatedly. In one application, the energies (W) of charged particles in a multi-species plasma can be used to establish a cut-off mass, $M_c$, where $M_1<M_c<M_2$ with $M_c=e^2B^2r^2/2W$, so that lower mass ions, $M_1$, will not cross the cusp, but the higher ions, $M_2$, will. In another application, selected particles of mass $M_s$, in a multi-species plasma, can have their energy and momentum raised by cyclotron resonance heating so that only particles having the selected mass, $M_s$, will cross the cusp. In this second application, the expression for the cut-off mass is normalized such that with $M_c/M_s=1=e^2B^2r_s^2/2W_sM_s$.

In light of the above, it is an object of the present invention to provide a cusp filter which will selectively heat ions of a particular mass in a multi-species plasma so that the selected particles can be separated from other particles in the plasma. Another object of the present invention is to provide a cusp filter wherein particles selected for separation from other particles have their energy and momentum elevated above other particles in a multi-species plasma by cyclotron resonance heating. Yet another object of the present invention is to provide a cusp filter which establishes a magnetic field configuration wherein a cut-off mass, $M_c$, can be determined so that particles having masses greater than $M_c$ will be influenced differently than particles having masses less than $M_c$ to thereby separate the particles of different mass from each other. Still another object of the present invention is to provide a cusp filter which is relatively easy to manufacture, simple to use, and comparatively cost effective.

SUMMARY OF THE PREFERRED EMBODIMENTS

A cusp filter in accordance with the present invention includes components for generating a magnetic null cusp that is located between opposed, axi-symmetric, back-to-back magnetic fields. Both of the back-to back magnetic fields in this case have equal magnitudes that are substantially equal to "B." Their respective magnetic field lines, however, are oriented in opposite directions along their mutual axis. With these orientations, the two magnetic fields establish a magnetic null cusp between them, in a plane that is oriented substantially perpendicular to the axis. As contemplated by the present invention, the opposed back-to-back magnetic fields are each generated in the chamber of a container, by a respective plurality of magnetic coils which are mounted on the container.

The cusp filter of the present invention also includes an injector. In addition to generating a multi-species plasma, the purpose of this injector is to direct both relatively low mass ions ($M_1$) and relatively high mass ions ($M_2$) in the multi-species plasma along the axis in the chamber toward the null cusp. As contemplated for the present invention, the separation of ions at the null cusp according to their respective masses can be initiated in either of two ways.

For one embodiment of the present invention, differences in either the energy or the momenta of ions in the multi-species are exploited to separate ions of mass ($M_1$) from ions of mass ($M_2$). More specifically, due to the relatively low energy, or momentum, of the low mass ions ($M_1$) they are prevented from crossing the null cusp. Instead, they are diverted away from the axis by the null cusp for subsequent collection. On the other hand, the relatively high energy, or momentum, of the high mass ions ($M_2$) will allow these ions to cross the null cusp and proceed along the axis through the filter chamber for subsequent collection. For this particular embodiment of the present invention, the magnitude, B, of the magnetic fields can be selected to identify a cut-off mass, $M_c$, such that $M_1<M_c<M_2$. The expression $M_c=e^2B^2r^2/2W$ can then be applied where "e" is the ion charge, "r" is the radial distance of an ion (charged particle) from the axis in the first magnetic. field, and W is the kinetic energy of the ion. In accordance with the expression for $M_c$, it will appreciated that the cusp filter can achieve its intended result if either the energy of the ions ($M_1$) is substantially equal to the energy of the ions ($M_2$), or the ions ($M_1$) and ($M_2$) are directed toward the null cusp at a substantially common axial velocity.

In an alternate embodiment of the present invention, ions of a selected mass, $M_s$, can be specifically targeted for separation from other ions in a multi-species plasma. Importantly, this can be accomplished regardless whether the selected ions are of comparably higher or lower mass. To do this, the ions of selected mass, $M_s$, are heated by cyclotron resonance. The energy of the resonance heated ions is thereby raised substantially above the energies of the other, non-selected ions in the multi-species plasma. As contemplated by the present invention, cyclotron resonance is accomplished using a cyclotron harmonics accelerator, such as a quadrant antenna. For this purpose, the quadrant antenna is operated at twice the resonant cyclotron frequency of the selected ions (2f). Consequently, due to the higher energies of the selected ions, when the multi-species plasma is directed toward the null cusp, the resonance heated ions will cross the cusp and continue their transit through the filter. The other ions, however, having lower energy, will be diverted from the filter by the null cusp and they will thereby be separated from the selected ions.

For either embodiment of the present invention, the cusp filter of the present invention will include a vacuum pump which is connected to the container. Specifically, the vacuum pump is used to maintain the multi-species plasma below a collisional density in the chamber. For purposes of the present invention, this collisional density is defined as a density wherein an ion can cross the null cusp before suffering a collision with another ion. Hence, the collisional density is achieved in a condition wherein the ratio of the collision frequency of an ion to its cyclotron frequency is less than the ratio of the distance of the ion from the axis, r, to the axial distance between the ion and the null cusp.

Several additional aspects of the cusp filter will apply regardless of its particular embodiment. For one, the cusp filter will include a radial collector that is mounted on the container and oriented substantially in the plane of the null cusp. As so positioned the radial collector is used for collecting ions as they are diverted away from the axis. Additionally the cusp filter can include an axial collector that is positioned substantially on the axis for collecting the ions as they proceed along the axis through the filter. In another aspect, the cusp filter can include a plurality of electrodes positioned on the container to bias the magnetic field immediately downstream from the injector to produce a radial electric field for uniformly increasing the energies of the ions in the multi-species plasma to reduce the sensitivity of $M_c$ to r. Finally, it is also possible for the cusp filter to incorporate an axi-symmetric third magnetic field which is coaxial with the first pair of back-to-back magnetic fields. If this is done, the third magnetic field will have a magnitude substantially equal to B, and it will have magnetic field lines that are oriented in opposition to the magnetic field lines of the middle magnetic field. With this configuration, a second null cusp will be established to divert ions away from the axis, in a manner as described above, to enhance the separation of ions in the multi-species plasma.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DESCRIPTION OF THE PREFERRED EMBODIMENT

Figure 1:
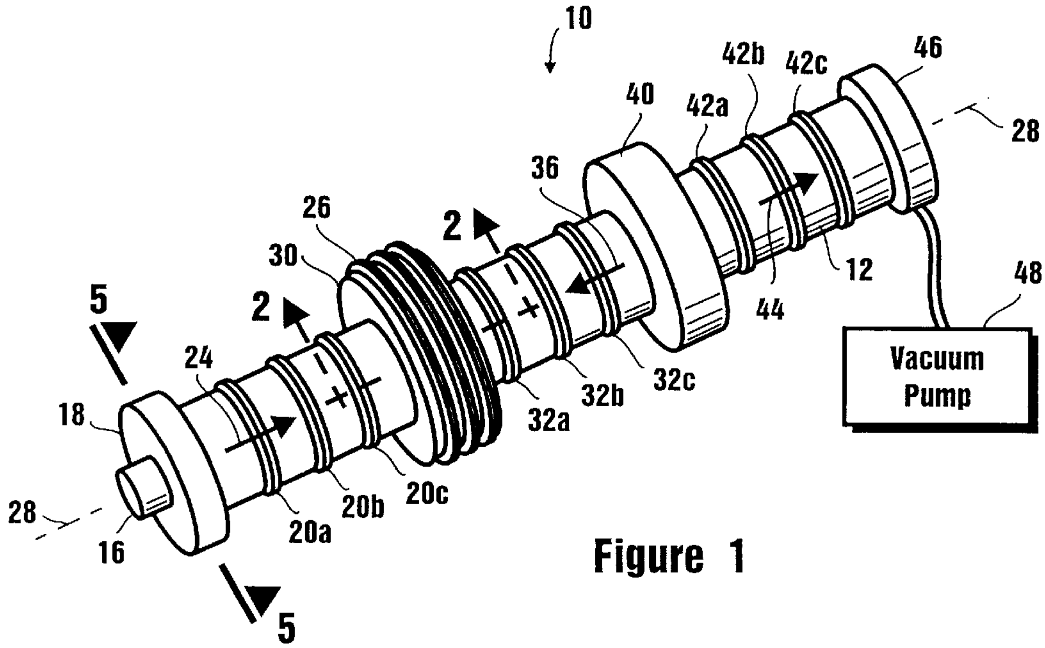
FIG. 1 is a perspective view of a cusp filter in accordance with the present invention.

Referring initially to FIG. 1, a magnetic cusp filter in accordance with the present invention is shown and is generally designated 10. As shown, the cusp filter 10 includes an elongated cylindrical container 12 which surrounds a plasma chamber 14 (see FIG. 2). At one end of the container 12, there is an injector 16 for generating a multi-species plasma which is to be introduced into the chamber 14. For purposes of the present invention, it is to be appreciated that the multi-species plasma will include at least two different type ions. One type ion has a relatively low mass ($M_1$), while the other type ion has a relatively high mass ($M_2$).

FIG. 1 also shows that the cusp filter 10 of the present invention can include a cyclotron harmonics accelerator 18. For purposes of the present invention, the cyclotron harmonics accelerator 18 is preferably a quadrant antenna, and is of a type well known in the pertinent art. Importantly, the cyclotron harmonics accelerator 18 should be capable of heating ions of a predetermined mass, after the ions have been introduced by the injector 16 into the chamber 14. Specifically, this heating is done by establishing resonance with the selected ions at a frequency which is twice the resonant cyclotron frequency, f, of the selected ions.

Still referring to FIG. 1, it is seen that the cusp filter 10 includes a first magnetic assembly which comprises a plurality of coaxial magnetic coils, of which the magnetic coils 20*a*, 20*b* and 20*c* are exemplary. More specifically, the magnetic coils 20 are mounted on the container 12 to generate a magnetic field 22 inside the chamber 14 of container 12 (see FIG. 2). Importantly, the magnetic field 22 has a magnitude, B, and the magnetic field lines of the magnetic field 22 are generally oriented along the central axis 28 of the container 12, in the direction of the arrow 24 (see both FIG. 1 and FIG. 2). Also, it can be seen in both FIG. 1 and FIG. 2 that a plurality of coaxial electrodes 26, of which the electrodes 26*a*, 26*b* and 26*c* are exemplary, can be mounted on the container 12. As intended for the cusp filter 10 of the present invention, the electrodes 26*a–c* are used to bias the magnetic field lines 22 during operation of the cusp filter 10, if desired.

Still referring to FIG. 1, it will be seen that the cusp filter 10 includes a radial collector 30. Further, it is seen in FIG. 1 that another plurality of magnetic coils 32 are mounted on the container 12 on the side of the radial collector 30 that is opposite from the plurality of magnetic coils 20. Like the coils 20*a–c*, the coils 32*a*, 32*b* and 32*c* are only exemplary. As perhaps best appreciated by cross referencing FIG. 1 with FIG. 2, the magnetic coils 32*a*, 32*b* and 32*c* are used to generate a magnetic field 34 whose magnetic field lines are oriented in a direction 36 that is axially opposed to the direction 24 of the magnetic field 22. The result of these opposed orientations for the respective magnetic fields 22 and 34 is the creation of a magnetic null cusp 38. Specifically, the null cusp 38 so-created will lie in a plane that is substantially perpendicular to the axis 28. Also, the magnetic flux function, $\psi$, in the null cusp 38 will be equal to zero ($\psi=0$). Accordingly, the magnetic field 22 will create a region on one side of the null cusp 38 where the magnetic flux function is positive ($+\psi$), while the magnetic field 34 on the other side of the null cusp 38 will create a region wherein the magnetic flux function is negative ($-\psi$).

Figure 2:
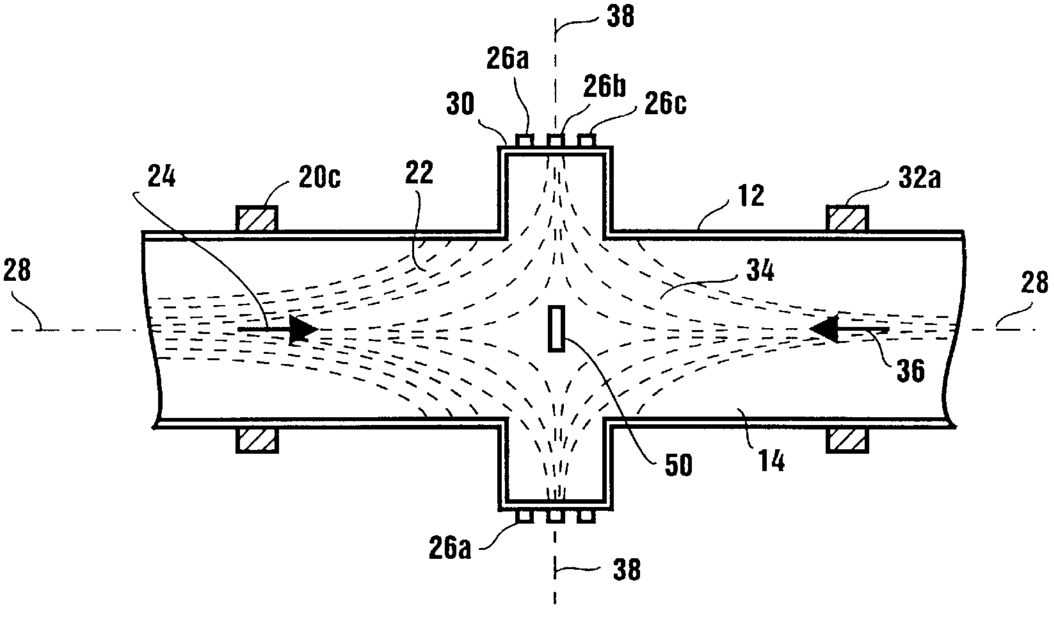
FIG. 2 is a cross sectional view of the cusp filter with representative magnetic field lines as seen along the line 2—2 in FIG. 1.

Although the magnetic fields 22 and 34, alone, are capable of accomplishing the objects of the present invention, in an alternate embodiment of the present invention, additional magnetic fields may be used to establish additional null cusps. As shown in FIG. 1, an additional radial collector 40 is provided between the magnetic coils 32*a–c* and an additional plurality of magnetic coils 42*a–c*. More specifically, the magnetic coils 42*a–c* are mounted on the container 12 substantially as shown, to generate a magnetic field in the chamber 14 which has magnetic field lines that are generally oriented along the axis 28 in the direction of the arrow 44. Consequently, a null cusp similar to the null cusp 38 at radial collector 30 will be established in the area of the radial collector 40. Regardless of the number of null cusps that are established for the filter 10, a terminal collector 46 can be positioned at the end of the chamber 14 opposite the injector 16 to collect ions which are not diverted into a radial collector 30, 40 by a null cusp 38 during the transit of the ions through the chamber 14. Additionally, an axial collector 50 can be employed as shown in FIG. 2. Specifically, the axial collector 50 is positioned on the axis 28 to collect ions traveling through the filter 10 along the axis 28 which are not effectively influenced by the combined effects of the magnetic field 22 and the null cusp 38. A similar axial collector can likewise be used in combination with the radial collector 40, for an embodiment using a collector 40.

FIG. 1 also indicates that a vacuum pump 48 is connected in fluid communication with the chamber 14. Importantly, the vacuum pump 48 is operated in concert with the injector 16 to maintain a collisional density inside the chamber 14. For purposes of the present invention, this collisional density is defined as a density wherein an ion can cross a null cusp (e.g. null cusp 38) before suffering a collision with another ion. Hence, the collisional density satisfies a condition wherein the ratio of a collision frequency of an ion, to its cyclotron frequency is less than the ratio of the radial distance r of an ion from the axis 28 to the axial distance of the ion to the null cusp 38.

Operation

In the operation of the filter 10, the injector 16 is activated to generate a multi-species plasma which includes a species of ions having a first mass ($M_1$), and a species of ions having a second mass ($M_2$). For purposes of disclosure, the mass ($M_2$) is considered to be greater than the mass ($M_1$). The object then, is for the filter 10 to separate ions of mass ($M_1$) from ions of mass ($M_2$).

Figure 3:
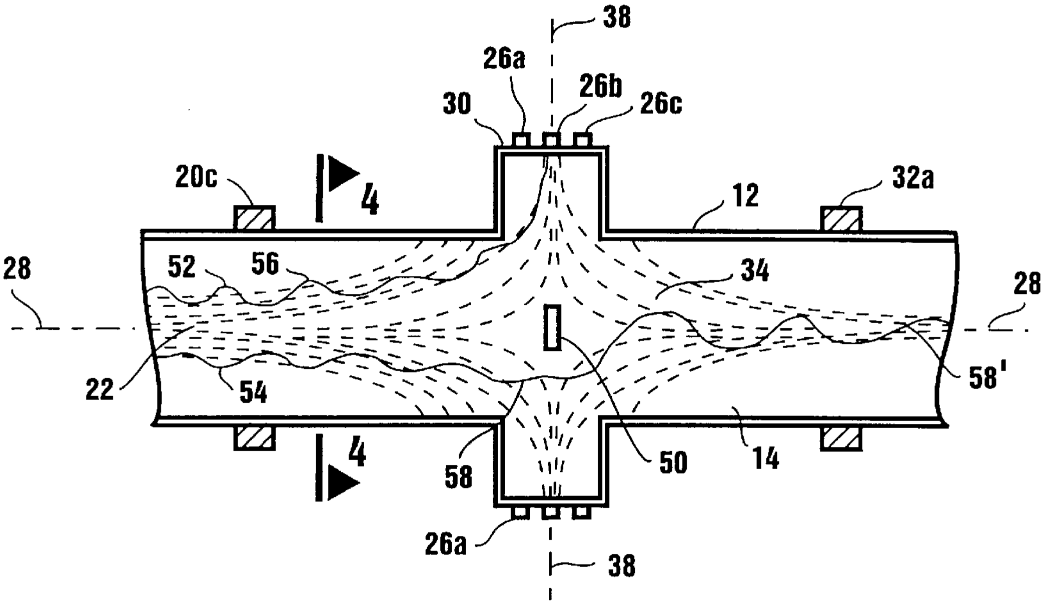
FIG. 3 is a view of the cusp filter as seen in FIG. 2 with representative ion paths superposed thereon.

In one aspect of the present invention, the ions of different mass can be separated from each other by the filter 10 because of differences in their respective momenta. For example, referring to FIG. 3, initially consider an ion of mass ($M_1$) located at the point 52 in chamber 14. Also, consider an ion of mass ($M_2$) located at the point 54. Further, consider that both ions ($M_1$ and $M_2$) satisfy the mathematics set forth above wherein the magnitude of the magnetic field 22 is B. As disclosed above, a cut-off mass, $M_c$, can be determined in the magnetic field 22 such that $M_1<M_c<M_2$ with $M_c=e^2B^2r^2/2W$, where "e" is the ion charge, "r"=0 is the radial distance of the ion (charged particle) from the axis 28 in the first magnetic field 22, and W is the kinetic energy of the ion. Further, the electrodes 26*a–c* can be activated to bias magnetic field 22. Specifically, this biasing can be done to produce a radial electric field which will uniformly increase the energies of the ions ($M_1$) and the ions ($M_2$). In turn, these increased energies reduce the sensitivity of $M_c$ to r and thereby enhance the effectiveness of the ion separation.

Under the conditions just described, it happens that the ion of mass ($M_1$) does not have sufficient momentum to cross the null cusp 38. Consequently, it will follow an orbital path 56 which diverts the ion of mass ($M_1$) from the null cusp 38 and into the radial collector 30. On the other hand, the ion of mass ($M_2$) will have sufficient momentum to carry it across the null cusp 38 along the orbital path 58. Thus, the ions of mass ($M_1$) can be separated from the ions of mass ($M_2$).

Figure 4:
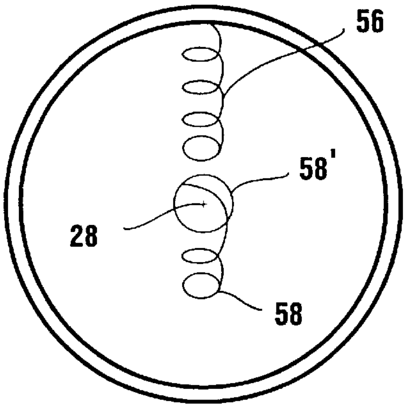
FIG. 4 is a schematic drawing of the ion paths illustrated in FIG. 3 as they would be seen along the line 4—4 in FIG. 3.

As mentioned above, depending on its energy and momentum, it is possible for an ion to have either of two types of orbits inside the chamber 14. In the case just mentioned, both the ion of mass ($M_1$) and the ion of mass ($M_2$) are in type-1 orbits before they reach the null cusp 38. As shown, the orbital path 56 for the ion of mass ($M_1$) does not cross the null cusp 38 and, thus, the ion of mass ($M_1$) remains in a type-1 orbit. Recall, in a type-1 orbit, the projection of the orbital paths 56, 58 onto a plane perpendicular to the magnetic field 22 will not encircle the axis 28. In this case (type-1 orbit) the angular momentum, P, and the magnetic flux function, ψ, have the same sign (i.e. $P\psi>0$). On the other hand, as the ion of mass ($M_2$) crosses the null cusp 38, its orbital path 58 changes from a type-1 orbital path 58 into a type-2 orbital path 58'. As mentioned above, in a type-2 orbit the projection of the orbital path 58' onto a plane perpendicular to the magnetic field 34 will encircle the axis 28. In this case (type-2 orbit) the angular momentum, P, and the magnetic flux function, ψ, have the opposite sign (i.e. $P\psi<0$). Importantly, as shown with the mathematics as discussed earlier, the orbit of a particle must change from type-1 to type-2, or vice versa, as the particle crosses through the null cusp 38. An illustration of the above is provided by cross referencing FIG. 3 and FIG. 4.

In another aspect of the present invention, it is possible to selectively raise the energy and momentum of ions (charged particles) having a predetermined mass, by resonance heating. The purpose here is to sufficiently raise the energy and momentum of the selected ions to a point which will allow them, but not other ions in the multi-species plasma, to cross the null cusp 38. The resonance heating that is necessary to accomplish this can be done using the cyclotron harmonics accelerator 18. For example, consider the case wherein the ions ($M_1$) have a first resonant frequency ($f_1$) and the ions ($M_2$) have a second resonant frequency ($f_2$). If it is desired that the ions of mass ($M_1$) be collected by the radial collector 30, and that the ions of mass ($M_2$) pass through the filter 10 for collection at the terminal collector 46, the cyclotron harmonics accelerator 18 can be operated to selectively resonate with the ions ($M_2$). It happens that this selective heating will substantially raise the energy of the ions ($M_2$) above the energy of the ions ($M_1$).

Figure 5:
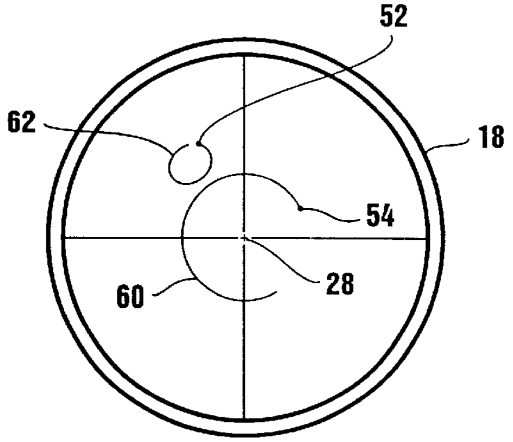
FIG. 5 is a schematic drawing of a quadrant antenna for a cyclotron harmonics accelerator as seen along the line 5—5 in FIG. 1 wherein a type-1 ion orbit and a type-2 ion orbit are shown in their respective relationship with the central axis of the cusp filter.

Referring now to FIG. 5, a schematic of a cyclotron harmonics accelerator 18 which can be used in the filter 10 of the present invention is shown. Preferably, the accelerator 18 is a quadrant antenna of a type well known in the art, and it is operable at twice the resonant cyclotron frequency of the ions which are selected for resonance heating. For example, if the ion of mass ($M_2$) are to be selectively heated, the operational frequency of the cyclotron harmonics accelerator 18 will be $2f_2$. With this in mind, consider an ion of mass ($M_1$) at the point 52 in the chamber 14, and an ion of mass ($M_2$) at the point 54 (see both FIG. 3 and FIG. 5). Even though they might not otherwise be able to cross the null cusp 38, due to the resonance heating provided by the cyclotron harmonics accelerator 18, the energy and momenta of the ions of mass ($M_2$) will be raised sufficiently to allow them to cross the null cusp 38. This, however, does not happen to the ions of mass ($M_1$) because they will not effectively respond to the frequency of $2f_2$. Recall, the ions ($M_1$) have a different resonant frequency ($f_1$). A consequence of this is that, before crossing the null cusp 38, the ions of mass ($M_2$) will achieve sustained type-2 orbital paths 60 around the axis 28. On the other hand, the ions of mass ($M_1$) will maintain type-1 orbital paths 62 and remain eccentric to the axis 28. Stated differently, the ions of mass ($M_1$) will not cross the null cusp 38 and, instead, will be diverted into the radial collector 30.

While the particular Cusp Filter as herein shown and disclosed in detail is fully capable of obtaining the objects and providing the advantages herein before stated, it is to be understood that it is merely illustrative of the presently preferred embodiments of the invention and that no limitations are intended to the details of construction or design herein shown other than as described in the appended claims.

What is claimed is:

1. A cusp filter for altering a multi-species plasma to separate ions of a first mass ($M_1$) from ions of a second mass ($M_2$) which comprises:

- a first magnetic assembly for generating a first magnetic field having a magnitude, B, with magnetic field lines oriented in a first direction along an axis;
- a second magnetic assembly for generating a second magnetic field having a magnitude substantially equal to B, and having magnetic field lines oriented in a second direction along said axis, said second magnetic field opposing said first magnetic field to establish a null cusp oriented substantially perpendicular to said axis between said first and second magnetic fields; and
- an injector for directing the ions ($M_1$) and the ions ($M_2$) with respective energies along said axis toward said null cusp to divert the ions ($M_1$) away from the axis and prevent them from crossing said null cusp, while allowing the ions ($M_2$) to cross the null cusp and proceed along said axis through said filter.

2. A cusp filter as recited in claim 1 wherein the magnitude of B is selected to identify a cut-off mass, $M_c$, such that $M_1<M_c<M_2$ with $M_c=e^2B^2r^2/2W$ where "e" is the ion charge, "r" is the radial distance of an ion from the axis in the first magnetic field, and W is the kinetic energy of the ion.

3. A cusp filter as recited in claim 2 further comprising:

- a container for defining a chamber with said first magnetic assembly and said second magnetic assembly being, respectively, a plurality of magnetic coils mounted on said container for generating said first magnetic field and said second magnetic field in said chamber; and
- a vacuum pump connected to said container for maintaining the multi-species plasma below a collisional density in said chamber, the collisional density being defined as a density wherein an ion can cross the null cusp before suffering a collision with another ion and the density satisfies a condition wherein the ratio of a collision frequency of an ion to its cyclotron frequency is less than the ratio of r to the axial distance of the ion to the null cusp.

4. A cusp filter as recited in claim 3 wherein said null cusp defines a plane and said filter further comprises:

- a radial collector mounted on said container and oriented substantially in said plane of said null cusp for collecting ions ($M_1$) as they are diverted away from said axis; and
- an axial collector mounted on said container and positioned substantially on said axis for collecting the ions ($M_2$) as they proceed along said axis through said filter.

5. A cusp filter as recited in claim 3 further comprising a means for biasing said first magnetic field to produce a radial electric field for uniformly increasing the energies of the ions ($M_1$) and the ions ($M_2$) to reduce the sensitivity of $M_c$ to r.

6. A cusp filter as recited in claim 1 wherein said energy of the ions ($M_1$) is substantially equal to said energy of the ions ($M_2$).

7. A cusp filter as recited in claim 1 wherein said injector directs the ions ($M_1$) and the ions ($M_2$) toward said null cusp at a substantially common axial velocity.

8. A cusp filter as recited in claim 1 wherein the ions ($M_1$) have a first resonant frequency ($f_1$) and the ions ($M_2$) have a second resonant frequency ($f_2$) and wherein the cusp filter further comprises a cyclotron harmonics accelerator, said cyclotron harmonics accelerator being operable to resonate with the ions ($M_2$) to substantially raise the energy of the ions ($M_2$) above the energy of the ions ($M_1$).

9. A cusp filter as recited in claim 9 wherein said cyclotron harmonics accelerator is operated at a frequency of $2f_2$.

10. A cusp filter as recited in claim 9 wherein said cyclotron harmonics accelerator is a quadrant antenna.

11. A cusp filter as recited in claim 1 wherein there are residual ions ($M_1$) in said second magnetic field and said cusp filter further comprises a third magnetic assembly for generating a third magnetic field having a magnitude substantially equal to B, and having magnetic field lines oriented in said first direction along said axis, said third magnetic field opposing said second magnetic field to establish an additional null cusp oriented substantially perpendicular to said axis between said second magnetic field and said third magnetic field to divert ions ($M_1$) away from the axis to enhance the separation of ions ($M_1$) from ions ($M_2$) in the plasma.

12. A cusp filter for altering a multi-species plasma to separate ions of a first mass ($M_1$) from ions of a second mass ($M_2$) which comprises:

a means for generating a null cusp defined by a zero magnetic flux function ($\psi=0$), said null cusp being positioned between a first region having a positive magnetic flux function ($+\psi$) and a second region opposed to said first region and having a negative magnetic flux function ($-\psi$), said null cusp being substantially planar and oriented substantially perpendicular to an axis; and an injector for directing the ions ($M_1$) and the ions ($M_2$) along said axis toward said null cusp with respective energies to divert the ions ($M_1$) away from the axis and prevent them from crossing said null cusp, while allowing the ions ($M_2$) to cross the null cusp and proceed along said axis through said filter.

13. A cusp filter as recited in claim 12 wherein said generating means comprises:

a first magnetic assembly for generating a first magnetic field having a magnitude, B, and having said positive magnetic flux function ($+\psi$) to orient magnetic field lines of said first magnetic field in a first direction along an axis; and a second magnetic assembly for generating a second magnetic field having a magnitude substantially equal to B, and having said negative magnetic flux function ($-\psi$) to orient magnetic field lines of said second magnetic field in a second direction along said axis, said second magnetic field opposing said first magnetic field to establish said null cusp between said first and second magnetic fields.

14. A cusp filter as recited in claim 13 wherein the magnitude of B is selected to identify a cut-off mass, $M_c$, such that $M_1<M_c<M_2$ with $M_c=e^2B^2r^2/2W$ where "e" is the ion charge, "r" is the radial distance of an ion from the axis in the first magnetic field, and W is the kinetic energy of the ion.

15. A cusp filter as recited in claim 12 wherein said energy of the ions ($M_1$) is substantially equal to said energy of the ions ($M_2$).

16. A cusp filter as recited in claim 12 wherein the ions ($M_1$) and the ions ($M_2$) have a substantially common axial velocity.

17. A cusp filter as recited in claim 12 wherein the ions ($M_1$) have a first resonant frequency ($f_1$) and the ions ($M_2$) have a second resonant frequency ($f_2$) and wherein the cusp filter further comprises a quadrant antenna operable at a frequency of $2f_2$ to resonate with the ions ($M_2$) to substantially raise the energy of the ions ($M_2$) above the energy of the ions ($M_1$).

18. A method for altering a multi-species plasma to separate ions of a first mass ($M_1$) from ions of a second mass ($M_2$) which comprises the steps of:

generating a null cusp having a zero magnetic flux function ($\psi=0$), said null cusp being positioned between a first region having a positive magnetic flux function ($+\psi$) and a second region opposed to said first region and having a negative magnetic flux function ($-\psi$), said null cusp being substantially planar and oriented substantially perpendicular to an axis; and directing the ions ($M_1$) and the ions ($M_2$) along said axis toward said null cusp with respective first and second energies to divert the ions ($M_1$) away from the axis and prevent them from crossing said null cusp, while allowing the ions ($M_2$) to cross the null cusp and proceed along said axis through a cusp filter.

19. A method as recited in claim 18 wherein said generating step comprises the steps of:

generating a first magnetic field with said positive magnetic flux function ($+\psi$) and having a magnitude, B, with magnetic field lines oriented in a first direction along an axis; and generating a second magnetic field with said negative magnetic flux function ($-\psi$) and having a magnitude substantially equal to B, with magnetic field lines oriented in a second direction along said axis, said second magnetic field opposing said first magnetic field to establish said null cusp between said first and second magnetic fields.

20. A method as recited in claim 19 further comprising the step of selecting the magnitude of B to identify a cut-off mass, $M_c$, such that $M_1<M_c<M_2$ with $M_c=e^2B^2r^2/2W$ where "e" is the ion charge, "r" is the radial distance of an ion from the axis in the first magnetic field, and W is the kinetic energy of the ion.

21. A method as recited in claim 20 further comprising the step of biasing said first magnetic field to produce a radial electric field for uniformly increasing the energies of the ions ($M_1$) and the ions ($M_2$) to reduce the sensitivity of $M_c$ to r.

22. A method as recited in claim 18 wherein the ions ($M_1$) have an energy substantially equal to the energy of the ions ($M_2$).

23. A method as recited in claim 18 wherein the ions ($M_1$) and the ions ($M_2$) have a substantially common axial velocity.

24. A method as recited in claim 18 wherein the ions ($M_1$) have a first resonant frequency ($f_1$) and the ions ($M_2$) have a second resonant frequency ($f_2$) and wherein said method further comprises the step of resonating the ions ($M_2$) with a frequency of $2f_2$ to substantially raise said second energy above said first energy.

25. A method as recited in claim 18 further comprising the steps of:

positioning a radial collector substantially in said planar of said null cusp for collecting the ions ($M_1$) as they are diverted away from said axis; and positioning an axial collector substantially on said axis for collecting the ions ($M_2$) as they proceed along said axis through said filter.

* * * * *

UNITED STATES PATENT AND TRADEMARK OFFICE
CERTIFICATE OF CORRECTION

PATENT NO. : 6,396,223 B1
DATED : May 28, 2002
INVENTOR(S) : Tihiro Ohkawa

It is certified that error appears in the above-identified patent and that said Letters Patent is hereby corrected as shown below:

Column 6,
Line 47, delete [ “r”=0 ] and insert -- “r” --

Signed and Sealed this

Thirtieth Day of July, 2002

*Attest:*

JAMES E. ROGAN

*Attesting Officer* *Director of the United States Patent and Trademark Office*